US009002160B2

(12) United States Patent
Colbourne

(10) Patent No.: US 9,002,160 B2
(45) Date of Patent: Apr. 7, 2015

(54) OPTICAL SWITCH HAVING A MULTIROW WAVEGUIDE ARRAY

(75) Inventor: Paul Colbourne, Ottawa (CA)

(73) Assignee: JDS Uniphase Corporation, Milpitas, CA (US)

( * ) Notice: Subject to any disclaimer, the term of this patent is extended or adjusted under 35 U.S.C. 154(b) by 308 days.

(21) Appl. No.: 13/558,791

(22) Filed: Jul. 26, 2012

(65) Prior Publication Data

US 2013/0209030 A1 Aug. 15, 2013

Related U.S. Application Data

(60) Provisional application No. 61/512,459, filed on Jul. 28, 2011.

(51) Int. Cl.

| | |
|---|---|
| ***G02B 6/26*** | (2006.01) |
| ***G02B 6/35*** | (2006.01) |
| ***B81B 7/04*** | (2006.01) |
| ***G02B 27/42*** | (2006.01) |
| *G02B 27/10* | (2006.01) |

(52) U.S. Cl.

CPC ................ *G02B 6/3546* (2013.01); *B81B 7/04* (2013.01); *G02B 6/3518* (2013.01); *G02B 27/42* (2013.01); *G02B 27/106* (2013.01); *G02B 27/1093* (2013.01)

(58) Field of Classification Search

USPC ........................................................... 385/17

See application file for complete search history.

(56) References Cited

U.S. PATENT DOCUMENTS

| | | | | |
|---|---|---|---|---|
| 6,487,334 | B2 | 11/2002 | Ducellier et al. | 385/22 |
| 6,650,802 | B1 | 11/2003 | Morse et al. | 385/17 |
| 6,711,316 | B2 | 3/2004 | Ducellier | 385/17 |
| 6,757,458 | B2 | 6/2004 | Neilson et al. | 385/18 |
| 6,870,985 | B2 | 3/2005 | Noonan | 385/17 |
| 7,039,267 | B2 | 5/2006 | Ducellier et al. | 385/17 |
| 8,731,403 | B2 * | 5/2014 | Martinelli et al. | 398/49 |
| 2003/0002781 | A1 | 1/2003 | Ford et al. | 385/18 |
| 2004/0252938 | A1 * | 12/2004 | Ducellier et al. | 385/27 |
| 2005/0002600 | A1 * | 1/2005 | Ducellier et al. | 385/17 |
| 2005/0063643 | A1 | 3/2005 | Watanabe et al. | 385/33 |
| 2007/0160321 | A1 | 7/2007 | Wu et al. | 385/24 |
| 2009/0028502 | A1 * | 1/2009 | Presley et al. | 385/18 |
| 2009/0067845 | A1 | 3/2009 | Zhong et al. | 398/83 |
| 2013/0202297 | A1 * | 8/2013 | Martinelli et al. | 398/49 |
| 2013/0209031 | A1 * | 8/2013 | McLaughlin et al. | 385/17 |

OTHER PUBLICATIONS

Alam, M.S.; Baker, A.M.A.; "Photonic MEMS based reconfigurable switch for multicast communication systems," 4th National Conference on Telecommunication Technology Proceedings, p. 171-175, Jan. 14-15, 2003.

* cited by examiner

*Primary Examiner* — Sung Pak
(74) *Attorney, Agent, or Firm* — JDS Uniphase Corporation

(57) ABSTRACT

An optical switch platform allowing dual and/or multicast optical switch geometries is disclosed. Only two waveguide arrays are used, one for the input, and one for the output. Multi-row waveguide array(s) can replace individual multiple single-row waveguide arrays for optical switch configurations employing a beam director configured to dispose a plurality of input optical beams in a multi-row pattern of optical beams at an angle-to-offset (ATO) optical element.

21 Claims, 11 Drawing Sheets

107A
108
100
110
106
112
104A
102
104
114
107B
f
f
116
118
144
y
x
z

OPTICAL SWITCH HAVING A MULTIROW WAVEGUIDE ARRAY

CROSS-REFERENCE TO RELATED APPLICATIONS

The present invention claims priority from U.S. Provisional Patent Application No. 61/512,459 filed Jul. 28, 2011 which is incorporated herein by reference for all purposes.

TECHNICAL FIELD

The present invention relates to optical network equipment, and in particular to optical switches.

BACKGROUND OF THE INVENTION

In an optical communications network, an optical signal is modulated with digital information and transmitted over a length of optical fiber from a source location to a destination location. An M×N optical switch module allows switching of optical signals from any one of M optical fibers to any one of N optical fibers spanning between various locations of the network. A multicasting M×N optical switch allows one to switch optical signals from one optical fiber to not one but, simultaneously, to a plurality of optical fibers, or to switch optical signals from a plurality of input optical fibers to a plurality of output optical fibers, such that optical signals in any of the input optical fibers can be multicast into non-overlapping subsets of the plurality of the output optical fibers.

One drawback of optical switches of the prior art is a large number of optical waveguides that need to be aligned in any given optical switch device. The optical alignment of individual waveguides is tedious and time-consuming. Waveguide arrays, including single rows of equidistantly spaced optical waveguides, can be used to simplify optical alignment. By way of example, Ducellier et al. in U.S. Pat. No. 6,487,334 disclose an optical switch using single-row optical fiber arrays and a concave mirror. Dual and even multiple optical switches can be constructed using multiple single-row fiber arrays disposed in a circle around the optical axis of the common concave mirror.

Detrimentally, in optical switches of Ducellier et al., individual and independent alignment of several waveguide arrays may be required, which increases device cost and reduces production yield. Accordingly, it is a goal of the invention to provide an optical switch, including a multicasting and/or a dual optical switch, in which only two waveguide arrays would need to be aligned.

SUMMARY OF THE INVENTION

In an optical switch of the invention, including dual and/or multicasting optical switch geometries, only two waveguide arrays are used, one for the input, and one for the output. According to the invention, multi-row waveguide array(s) can replace multiple single-row waveguide arrays in certain optical switch geometries, characterized in that a beam director is configured to dispose the plurality of input optical beams in a multi-row pattern of optical beams at an angle-to-offset (ATO) optical element. The output waveguide array of such an optical switch includes a multi-row array of output waveguides, corresponding to the multi-row pattern of the optical beams at the ATO optical element. The invention works equally well for regular M×N, multicast M×N, and/or dual/multiple optical switches in a single package, sharing some common optical elements.

In accordance with the invention, there is provided an optical switch comprising:

an input waveguide array for inputting a plurality of optical beams;

a first director optically coupled to the input waveguide array, for redirecting or splitting each of the plurality of optical beams, wherein each optical beam of the plurality of optical beams, redirected or split by the first director, is characterized by a beam angle and a beam offset;

an ATO optical element having a focal length, disposed downstream of the first director at a distance substantially equal to the focal length, for transforming the beam angles of the plurality of optical beams redirected or split by the first director into beam offsets of the plurality of optical beams at a distance substantially equal to the focal length downstream of the ATO optical element, and transforming the beam offsets of the plurality of optical beams redirected or split by the first director into beam angles of the plurality of optical beams at the distance substantially equal to the focal length downstream of the ATO optical element;

wherein the first director is configured to dispose the plurality of optical beams, redirected or split thereby, in a multi-row pattern of optical beams at the ATO optical element;

a second director optically coupled to the ATO optical element and disposed at a distance substantially equal to the focal length downstream of the ATO optical element, for redirecting the plurality of optical beams exiting the ATO optical element; and an output waveguide array coupled to the second director, for receiving the plurality of optical beams redirected by the second director, wherein the output waveguide array comprises a multi-row array of output waveguides, corresponding to the multi-row pattern of the optical beams at the ATO optical element.

The first director of a multicast version of the switch can include a diffractive bulk optic beamsplitter for splitting each of the plurality of optical beams into an angular fan of beams. The first director of a regular version of the switch can include an array of tiltable MEMS mirrors for reflecting the plurality of optical beams at adjustable angles, one angle at a time. In the former embodiment, all the beams in the angular fan of beams are present simultaneously; in the latter, they are present one by one, depending on the angles of tilt of the MEMS mirrors. The ray paths and most of other optics of these two optical switch embodiments are essentially identical, including multi-row input and/or output waveguide arrays. The invention works equally well with both embodiments.

In accordance with another aspect of the invention, there is further provided a multicast optical switch comprising:

an input waveguide array for inputting a plurality of optical beams;

a diffractive bulk optic beamsplitter optically coupled to the input waveguide array, for splitting each of the plurality of optical beams into a plurality of sub-beams, wherein each optical sub-beam of the plurality of optical sub-beams split by the diffractive bulk optic beamsplitter is characterized by a beam angle and a beam offset;

an ATO optical element having a focal length, disposed downstream of the diffractive bulk optic beamsplitter at a distance substantially equal to the focal length, for transforming the beam angles of the plurality of optical sub-beams into beam offsets of the plurality of optical sub-beams at a distance substantially equal to the focal length downstream of the ATO optical element, and for transforming the beam offsets of the plurality of optical sub-beams into beam angles of the plurality of optical sub-beams at the distance substantially equal to the focal length downstream of the ATO optical element;

wherein the diffractive bulk optic beamsplitter is configured to dispose the plurality of optical sub-beams into a multi-row pattern of optical sub-beams at the ATO optical element;

an array of tiltable MEMS mirrors optically coupled to the ATO optical element and disposed at a distance substantially equal to the focal length downstream of the ATO optical element, for reflecting the plurality of optical sub-beams exiting the ATO optical element at adjustable angles; and an output waveguide array optically coupled to the array of tiltable MEMS mirrors, for receiving the plurality of optical sub-beams redirected by the array of tiltable MEMS mirrors;

wherein each particular one of the tiltable MEMS mirrors is disposed for coupling a selectable one of the plurality of optical sub-beams exiting the ATO optical element to a predefined waveguide of the output waveguide array, corresponding to the particular MEMS mirror; and wherein the output waveguide array comprises a multi-row array of output waveguides, corresponding to the multi-row pattern of the optical sub-beams at the ATO optical element.

An optical switch of the invention can also include a pair of telescopes, one disposed in an optical path between the input waveguide array and the first director/diffractive beamsplitter, and one disposed in an optical path between the second director/MEMS mirror array and the output waveguide array.

BRIEF DESCRIPTION OF THE DRAWINGS

Exemplary embodiments will now be described in conjunction with the drawings, in which.

DETAILED DESCRIPTION OF THE INVENTION

Figures 1A, 1B, 1C:
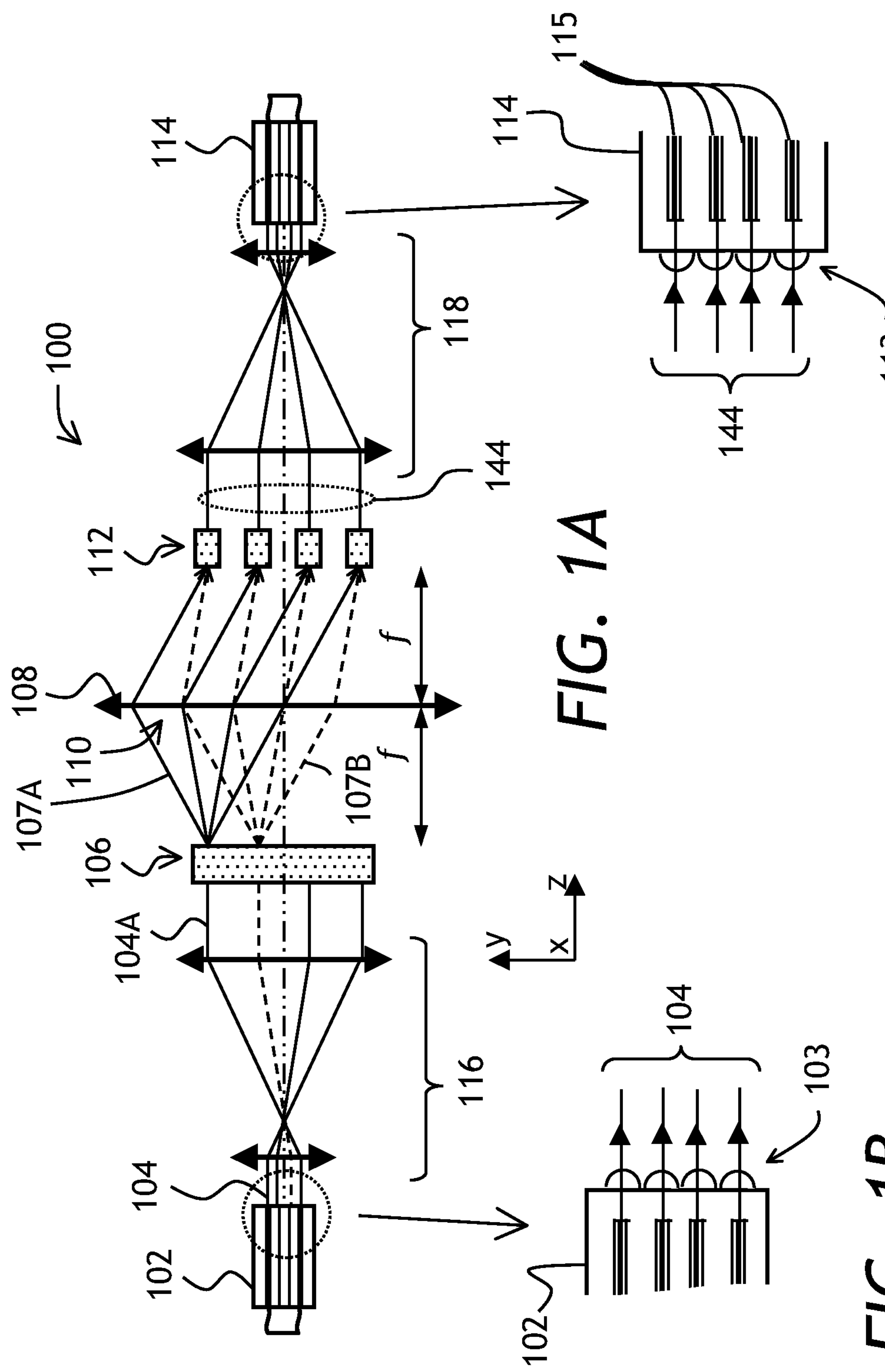
FIG. 1A is a plan view of an optical switch of the invention.
FIGS. 1B and 1C are magnified plan views of input and output waveguide arrays, respectively, of the optical switch of FIG. 1A.

While the present teachings are described in conjunction with various embodiments and examples, it is not intended that the present teachings be limited to such embodiments. On the contrary, the present teachings encompass various alternatives, modifications and equivalents, as will be appreciated by those of skill in the art. In all Figures except for FIGS. 9A, 9B, like reference numerals denote like elements. A same numeral does not necessarily denote a completely identical element, but rather denotes a corresponding element or an element having a similar functionality or purpose.

Referring to FIGS. 1A to 1C, an optical switch 100 of the invention includes an input waveguide array 102 for inputting a plurality of optical beams 104, one beam per one waveguide. A first director 106 is optically coupled to the input waveguide array 102 through an optional input telescope 116. In the embodiment shown, the first director 106 is a diffractive beamsplitter for splitting each of the plurality of optical beams 104 into a plurality of sub-beams, forming an angularly spread fan of directions. In another embodiment, the first director 106 can include an array of tiltable mirrors for individually redirecting each of the plurality of optical beams 104 along only one direction of the fan of directions. In both cases, the optical beams travel essentially along the same beam paths; accordingly, the first director 106 in form of beamsplitter will be considered by way of example, and it is to be kept in mind that for any of the embodiments discussed below, the beamsplitter can be replaced with an array of individually tiltable MEMS mirrors, to independently redirect individual optical beams. Each optical beam of the plurality of optical beams 104, redirected or split by the first director 106, is characterized by a beam angle and a beam offset.

An angle-to-offset (ATO) optical element 108, shown in FIG. 1A as a lens having a focal length f, is disposed downstream of the first director 106 at a distance substantially equal to f. The function of the ATO optical element 108 is to transform the beam angles of the plurality of optical beams 104 redirected or split by the first director 106 into beam offsets of the plurality of optical beams at a distance substantially equal to f downstream of the ATO optical element 108, and to transform the beam offsets of the plurality of optical beams 104 redirected or split by the first director 106 into beam angles of the plurality of optical beams at the distance substantially equal to f downstream of the ATO optical element 108. By way of example, beams 107A, shown in solid lines, have a same beam offset, corresponding to a position of a first beam 104A of the plurality of optical beams 104, and different beam angles upstream (to the left) of the ATO optical element 108. Downstream (to the right) of the ATO optical element 108, the beams 107A have a same beam angle corresponding to the common beam offset of the beam 104A upstream of the ATO optical element 108, and a plurality of beam offsets corresponding to the different beam angles of the beams 107A upstream of the ATO optical element 108. Beams 107B, shown in dashed lines, have a different beam offset than the beams 107A. Accordingly, the angles of the beams 107B downstream of the ATO optical element 108 are equal to each other but different from the angles of the beams 107A shown in solid lines.

The first director 106 is configured to dispose the plurality of optical beams 104, redirected or split thereby, in a multi-row pattern 110 of optical beams at the ATO optical element 108. A second director 112 is optically coupled to the ATO optical element 108 and disposed at a distance substantially equal to f downstream of the ATO optical element 108, for redirecting the plurality of optical beams 107A, 107B exiting the ATO optical element 108. Not all beams exiting the first director are shown, for clarity of FIG. 1A. In the embodiment shown in FIG. 1A, the second director 112 includes an array of transmissive directors, for example an array of phase elements, each phase element for receiving one of each of the beams 104A or sub-beams 107A and 107B, and for steering individual beams or sub-beams to a corresponding output port of the plurality of output ports 114. It is to be understood, however, that the optical switch 100 is shown in transmission, that is, is shown as including transmissive elements, for ease of illustration, and for ease of following the optical paths. The second director can also denote tiltable MEMS mirrors for reflecting the plurality of optical beams 107A, 107B at adjustable angles. Other directors can be used. Reflective elements, including a reflective ATO optical element 108 such as a concave mirror, can be used as well. An example of a reflective optical switch will be given further below.

An output waveguide array 114 is optically coupled to the second director 112 through an optional output telescope 118, for receiving a plurality of optical beams 144 redirected by the second director 112. Each particular one of the tiltable MEMS mirrors of the second director 112 is disposed for coupling a selectable one of the plurality of optical beams or sub-beams exiting the ATO optical element 108 to a predefined waveguide of the output waveguide array 114, corresponding to the particular MEMS mirror. The output waveguide array 114 includes an array of output waveguide rows 115, arranged in accordance with to the multi-row pattern 110 of the optical beams 107A, 107B at the ATO optical element 108.

In the embodiment shown, the input and output waveguide arrays 102 and 114 include optional input and output microlens arrays 103 and 113, respectively, one microlens per one waveguide. The function of the microlens arrays 103 and 113 is to form and receive, respectively, the plurality of optical beams of an appropriate diameter. The function of the input telescope 116 is to optically couple the input waveguide array 102 and the first director 106, and to match a beam size of the optical beams 104 emitted by the input waveguide array 102 to a beam size of the optical beams 104 at the first director 106. The function of the output telescope 118 is to optically couple the second director 112 and the output waveguide array 114, and to match the waveguide pitch of the output waveguide array 114 to a pitch of the MEMS mirrors of the second director 112. Gaussian beam propagation formulas, which are known in the art, can be used to calculate required beam sizes and corresponding focal lengths and positions of the microlens arrays 103 and 113.

It is to be noted that exemplary embodiments of an optical switch of the invention, shown in side elevational views in FIGS. 2A, 3A, 5A, and 6A, all have the same plan view of the optical switch 100 of FIG. 1A. Accordingly, when considering the side elevational views of various embodiments shown in FIGS. 2A, 3A, 5A, and 6A, it is to be kept in mind that all of these embodiments have the plan view shown in FIG. 1A. The plan view of FIG. 1A is in YZ plane.

Figures 2A, 2B, 2C:
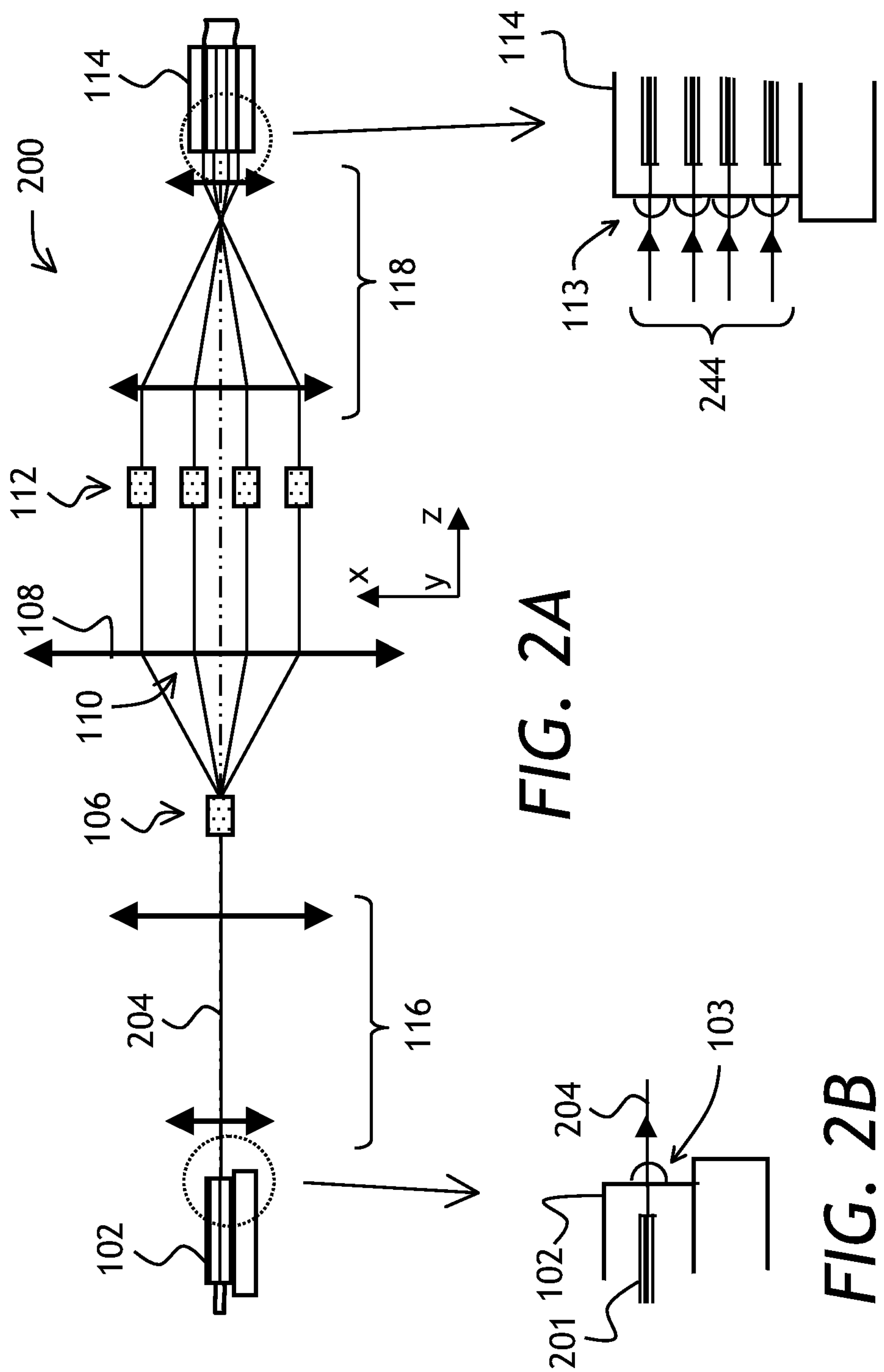
FIG. 2A is a side elevational view of an embodiment of an optical switch of the invention, including a biaxial tiltable MEMS array.
FIGS. 2B and 2C are magnified side views of input and output waveguide arrays, respectively, of the optical switch of FIG. 2A.

Turning to FIGS. 2A to 2C with further reference to FIG. 1A, an optical switch 200, shown in a side elevational view, or in XZ plane, looks the same in plan view as the optical switch 100 of FIG. 1A. The input waveguide array 102 of the optical switch 200 of FIG. 2A includes a first row of M input optical fibers 201 for emitting M optical beams 204. The first director 106 is configured for redirecting or splitting each of the M optical beams 204 in a two-dimensional fan of N directions including $N_1$ rows and $N_2$ columns, thereby disposing the M optical beams in the multi-row pattern 110 of optical beams at the ATO optical element 108. In the optical switch 200 of FIG. 2, the array of tiltable MEMS mirrors 112 includes $N_1$ rows and $N_2$ columns of MEMS mirrors, and the output waveguide array 114 includes a multi-row optical fiber array having $N_1$ rows and $N_2$ columns of optical fibers corresponding to the $N_1$ rows and $N_2$ columns of the MEMS mirrors, one fiber per one mirror. In operation, the output waveguide array 114 receives output optical beams 244 redirected by the array of tiltable MEMS mirrors 112. Individual optical beams 244 are redirected by individual MEMS mirrors of the array 112.

In FIGS. 2A and 1A, $M=N_1=N_2=4$, and N=16. Generally, herein and throughout the rest of the specification, M, N, $N_1$, and $N_2$ can be any integer numbers >1, and $N=N_1 \cdot N_2$. Of course, the maximal number of input and output waveguides M and N is limited by available waveguide arrays, maximum size and steering angle of MEMS mirrors in the second director 112, the maximum number of mirrors manufacturable on one MEMS array, and the physical space available for the device package.

Figures 3A, 3B, 3C:
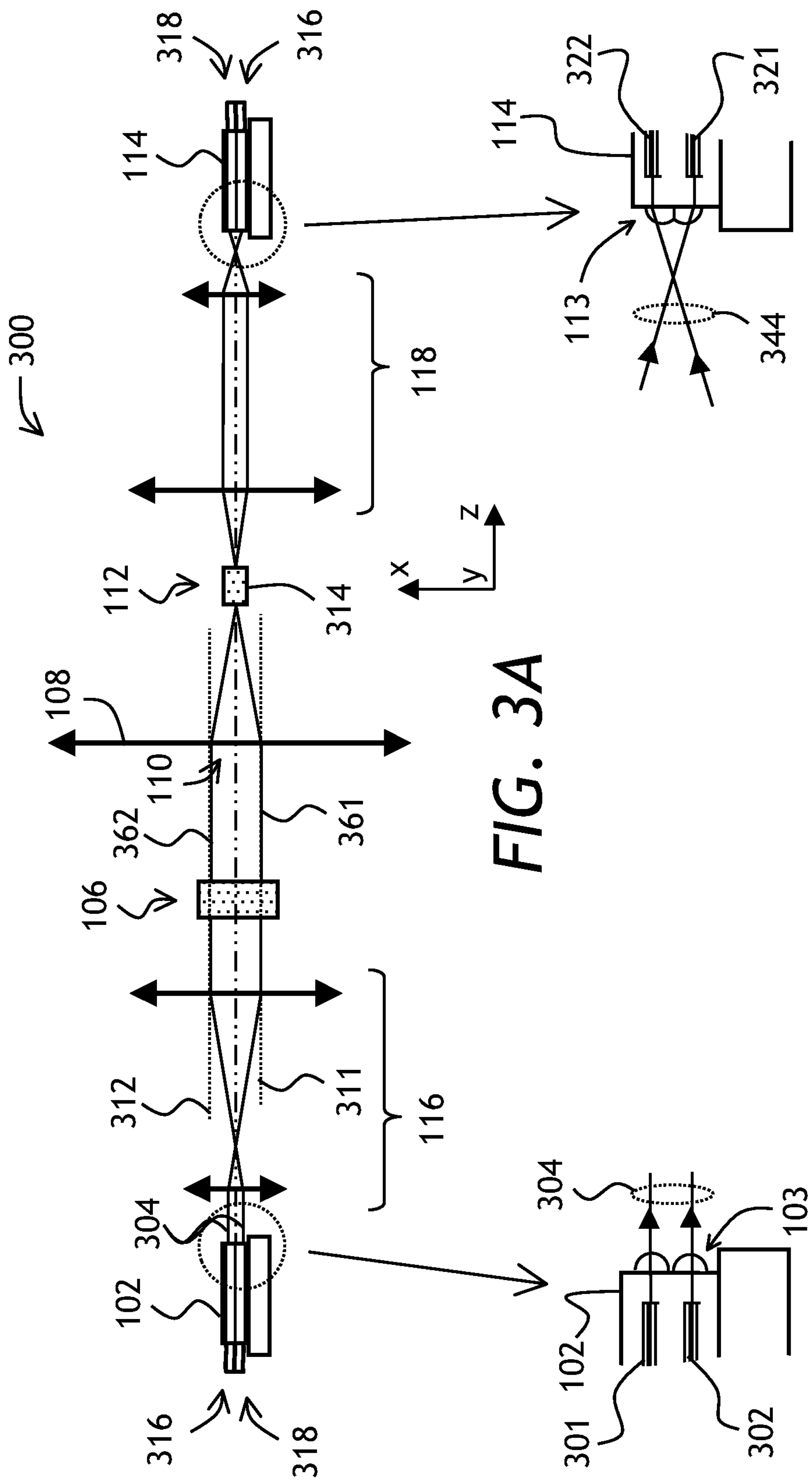
FIG. 3A is a side elevational view of an embodiment of a ganged dual optical switch of the invention.
FIGS. 3B and 3C are magnified side views of input and output waveguide arrays, respectively, of the ganged dual optical switch of FIG. 3A.

Referring now to FIGS. 3A to 3C with further reference to FIG. 1A, an optical switch 300, shown in a side elevational view, has a same plan view as the optical switch 100 of FIG. 1A. The input waveguide array 102 of the optical switch 300 includes first 301 and second 302 laterally offset parallel rows and of M input optical fibers, each row for emitting M optical beams 304. The output waveguide array 114 includes first 321 and second 322 laterally offset parallel rows of N output optical fibers, each row for receiving N optical beams 344. The first director 106 is configured for redirecting or splitting each of the M optical beams 304 emitted by the first 301 and second 302 rows of the input optical fibers into a plurality of sub-beams, forming in a fan of N directions disposed in first 311 and second 312 planes, respectively, running parallel to YZ plane. These fans of beams are best represented at 107A and 107B in FIG. 1A, which is drawn in YZ plane. Referring back to FIG. 3A, the first and second planes 311 and 312 are laterally offset from each other. First 361 and second 362 rows of optical beams disposed in the planes 311 and 312, respectively, form the pattern 110 of optical beams at the ATO optical element 108. The second director 112 (a MEMS array) includes a single row 314 of N tiltable MEMS mirrors for reflecting the first 361 and second 362 rows of optical beams at adjustable angles.

In operation, each optical beam of the first row 361 of optical beams is reflected by a same tiltable MEMS mirror of the row 314 of N tiltable MEMS mirrors as a corresponding optical beam of the second row 362 of optical beams. Since the respective optical beams of the first and second rows 361 and 362 are switchable by the same MEMS mirrors, the respective optical beams are switchable simultaneously. As a result, the optical switch 300 includes first 316 and second 318 M×N optical sub-switches operable in a gang fashion. The first M×N optical sub-switch 316 includes the first rows 301 and 321 of the M input and N output optical fibers, and the second optical sub-switch 318 includes the second rows 302 and 322 of the M input and N output optical fibers.

Referring specifically to FIGS. 3B and 3C, the input optical beams 304 are parallel to each other, while output optical beams 344 are at an angle to each other, because the optical beams 304 emitted by the first and second rows 301 and 302 are directed by the ATO optical element 108 at an angle to each other, impinging on the same row 314 of MEMS mirrors. To couple the angled beams 344, the optical axes of the microlenses 113 are offset relative to respective planes of the parallel rows 321 and 322 of output fibers.

Figure 4A:
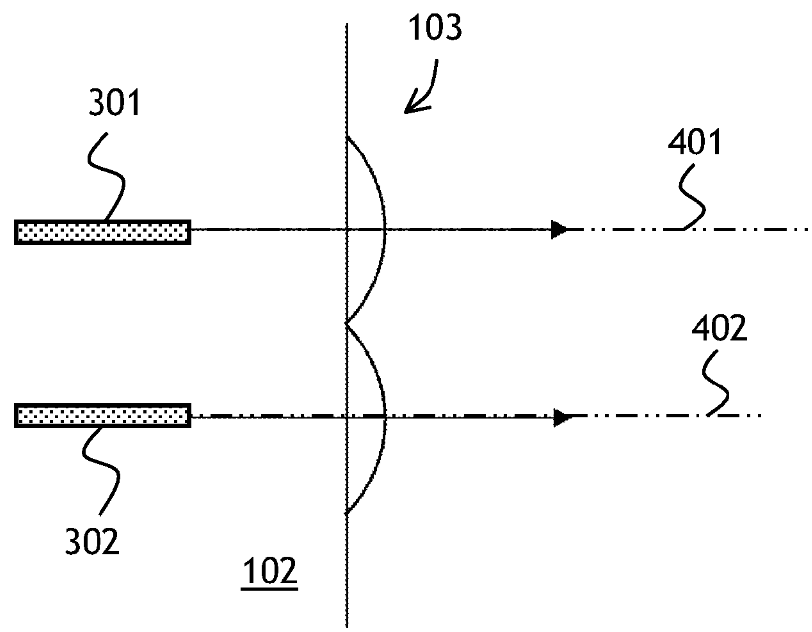
FIGS. 4A and 4B are side cross-sectional views of input and output microlens arrays, respectively, of the ganged dual optical switch of FIG. 3A.
Figure 4B:
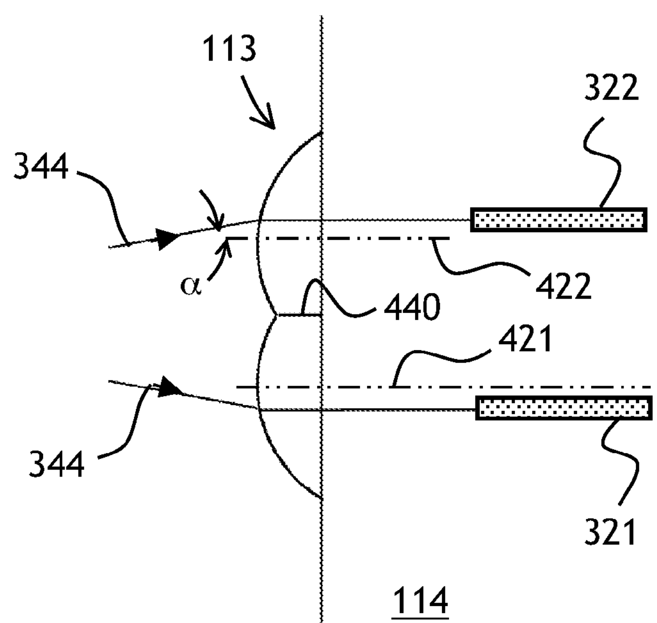

The latter point is illustrated in more detail in FIGS. 4A and 4B. In FIG. 4A, optical axes 401 and 402 of the first and second rows of microlenses of the input microlens array 103 respectively coincide with axes of the first and second rows 301 and 302 of the input optical fibers. In FIG. 4B, optical axes 421 and 422 are laterally offset from corresponding output optical fibers 321 and 322 of the output fiber array 114, for coupling the optical beams 344 disposed at an angle $\alpha$ with respect to the optical axes 421 and 422. The microlenses 113 touch each other at a line 440. This is done to maximize useful optical aperture of the microlenses 113.

Figures 5A, 5B, 5C:
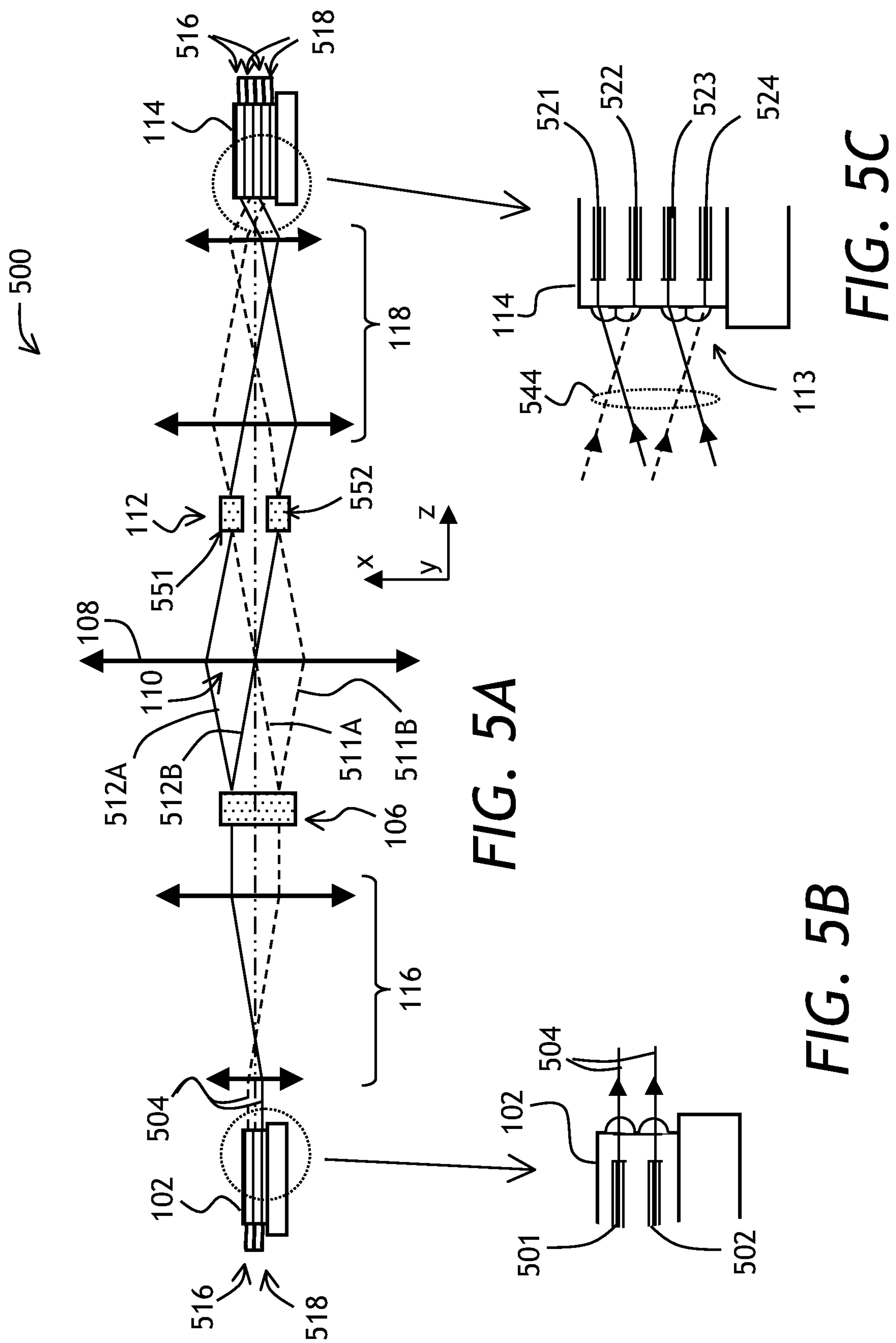
FIG. 5A is a side elevational view of another embodiment of a ganged dual optical switch of the invention.
FIGS. 5B and 5C are magnified side views of input and output waveguide arrays, respectively, of the ganged dual optical switch of FIG. 5A.

Turning now to FIGS. 5A to 5C with further reference to FIG. 1A, an optical switch 500, shown in a side elevational view, has a same plan view as the optical switch 100 of FIG. 1A. In the optical switch 500 of FIG. 5, the input waveguide array 102 includes first 501 and second 502 laterally offset parallel rows of M input optical fibers, each row for emitting M optical beams 504, and the output waveguide array 114 includes first to fourth 521 . . . 524 laterally offset parallel rows of N/2 output optical fibers, each row 521 . . . 524 for receiving N/2 output optical beams 544. The first director 106 is configured for redirecting or splitting each of the M optical beams 504 emitted by first and second rows 501 and 502 of the input optical fibers in a two-dimensional fan of N directions including first and second rows of N/2 directions 511A, 512A and 511B, 512B, thereby forming the multi-row pattern 110 of optical beams at the ATO optical element. For instance, the M optical beams 504, emitted by the first row 501 of optical fibers and shown in dashed lines, are redirected or split into the first row 511A and the second row 511B of directions, while the M optical beams 504, emitted by the second row 502 of optical fibers and shown in solid lines, is redirected or split into the first row 512A and the second row 512B of directions. The second director 112, shown as the array of tiltable MEMS mirrors, includes first 551 and second 552 rows of N/2 tiltable MEMS mirrors, one row per row of directions 511A, 512A; and 511B, 512B of the two-dimensional fan of directions.

In operation, each optical beam emitted by the first row 501 of the M input optical fibers is reflected by a same tiltable MEMS mirror of the array of tiltable MEMS mirrors as a corresponding optical beam emitted by the second row 502 of input optical fibers, so that the optical beams emitted by the first 501 and second 502 rows of input optical fibers are switchable simultaneously. As a result, the optical switch 500 includes first 516 and second 518 M×N optical sub-switches operable in a gang fashion, wherein the first M×N optical sub-switch 516 includes the first row 501 of the M input optical fibers and the first 521 and the third 523 rows of the N/2 output optical fibers, and the second M×N optical sub-switch 518 includes the second row 502 of the M input optical fibers and the second 522 and the fourth 524 rows of the N/2 output optical fibers.

Referring specifically to FIGS. 5B and 5C, the input optical beams 504 are parallel to each other, while pairs of output optical beams 544 are at an angle to each other. To couple the angled beams 544 into respective optical fibers, the optical axes of the microlenses of the output array 113 are offset relative to respective planes of the parallel rows 521 to 524 of output optical fibers, as shown.

Figures 6A, 6B, 6C:
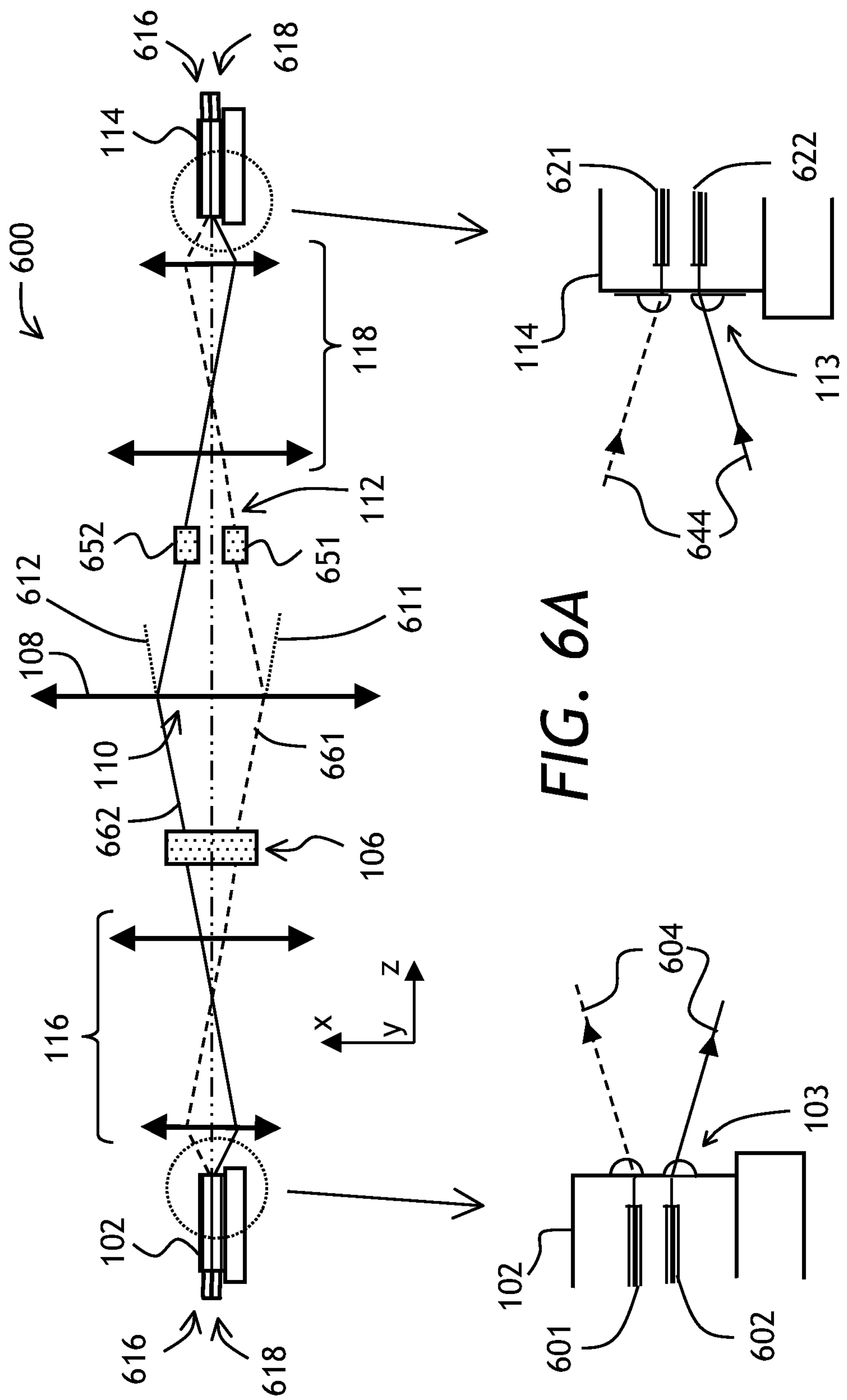
FIG. 6A is a side elevational view of an embodiment of a dual optical switch of the invention with independent operation of individual switches.
FIGS. 6B and 6C are magnified side views of input and output waveguide arrays, respectively, of the dual optical switch of FIG. 6A.

Referring now to FIGS. 6A to 6C with further reference to FIG. 1A, an optical switch 600, shown in a side elevational view, has a same plan view as the optical switch 100 of FIG. 1A. In the optical switch 600 of FIG. 6, the input waveguide array 102 includes first 601 and second 602 laterally offset parallel rows of M input optical fibers, each row for emitting M optical beams 604. The output waveguide array 114 includes first 621 and second 622 laterally offset parallel rows of N output optical fibers, each row for receiving N optical beams 644. The first director 106 is configured for redirecting or splitting each of the M optical beams 604 emitted by the first 601 and second 602 rows of the input optical fibers in a fan of N directions disposed in first 611 and second 612 planes, respectively, thereby forming the multi-row pattern 110 at the ATO optical element 108, the multi-row pattern 110 including first 661 and second 662 rows of optical beams, respectively. The second director 112, shown as the array of tiltable MEMS mirrors, includes first 651 and second 652 rows of N tiltable MEMS mirrors, for reflecting the first 661 and second 662 rows of optical beams, respectively, at adjustable angles.

In operation, each optical beam of the first row 661 of optical beams is reflected by a particular tiltable MEMS mirror of the first row 651 of the N tiltable MEMS mirrors, and each optical beam of the second row 662 of optical beams is reflected by a particular tiltable MEMS mirror of the second row 652 of the N tiltable MEMS mirrors, whereby the optical beams of the first 661 and second 662 rows are switchable independently. As a result, the optical switch 600 includes independently operable first 616 and second 618 M×N optical sub-switches, wherein the first M×N optical sub-switch 616 includes the first rows of the M input 601 and N output 621 optical fibers and the first row 651 of the N tiltable MEMS mirrors, and wherein the second M×N optical sub-switch 618 includes the second rows of the M input 602 and N output 662 optical fibers and the second row 652 of the N tiltable MEMS mirrors.

Referring specifically to FIGS. 6B and 6C, the input optical beams 604 are at an angle to each other, and output optical beams 644 are at an angle to each other. To couple the angled beams 604 and 644, the optical axes of microlenses of the input and output microlens arrays 103 and 113 are offset relative to respective planes of the parallel rows 601, 602; and 621, 622 of input and output fibers, respectively. Alternatively, the microlens-fiber arrangement of FIG. 4B can be used.

Figure 7A:
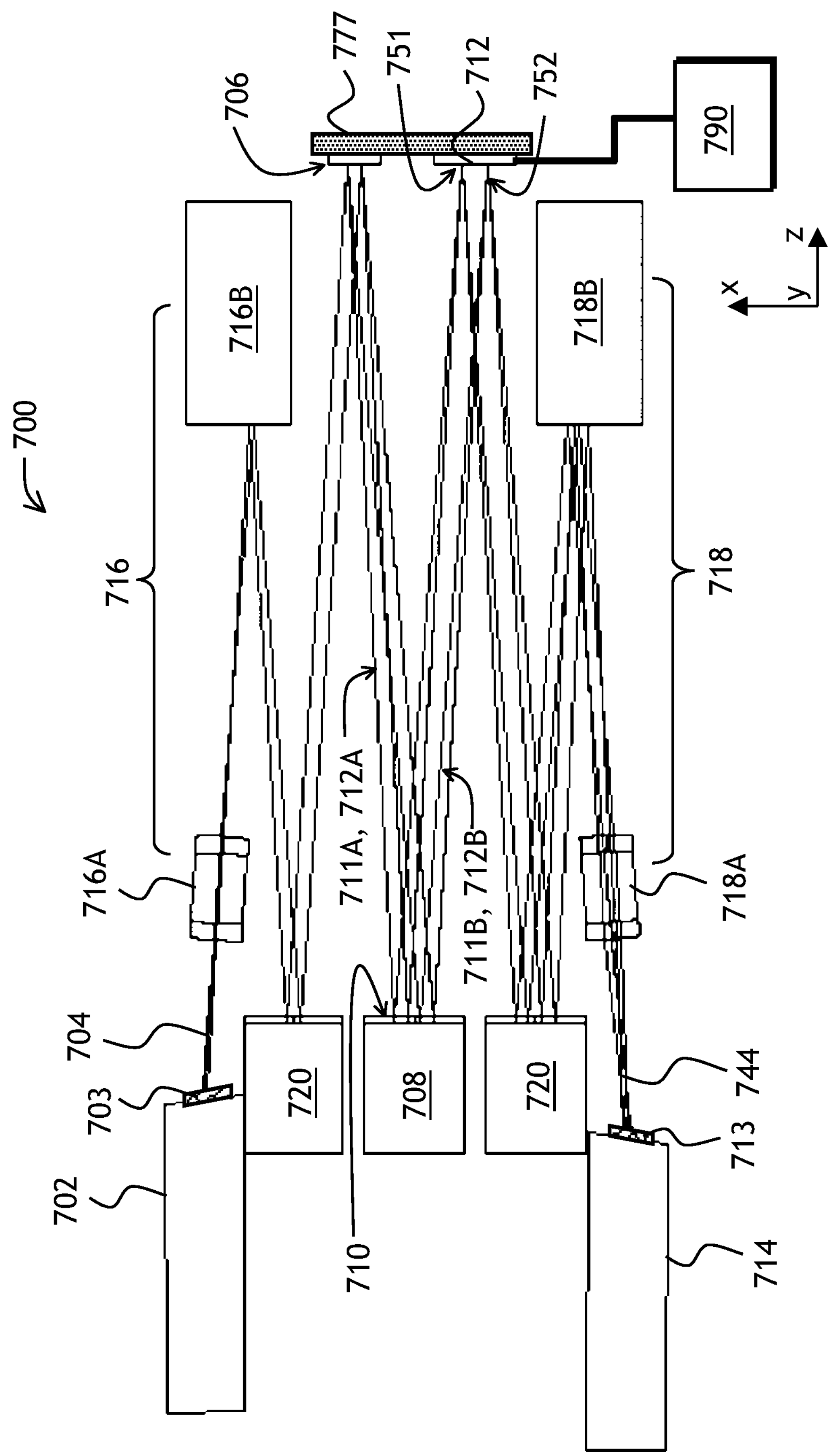
FIG. 7A is a plan view of a reflective dual ganged multicast optical switch according to the invention.

Turning now to FIG. 7A with further reference to FIG. 1A, a multicast optical switch 700 of FIG. 7A is a multicast implementation of the optical switch 100 of FIG. 1A using reflective optics. The multicast optical switch 700 of FIG. 7A includes an input waveguide array 702 for inputting a plurality of optical beams 704. A reflective diffractive bulk optic beamsplitter 706 is optically coupled to the input waveguide array 702. The function of the diffractive bulk optic beamsplitter 706 is to split each of the plurality of optical beams

704 into a plurality of sub-beams. Each optical sub-beam of the plurality of optical beams 704 split by the diffractive bulk optic beamsplitter 706 is characterized by a beam angle and a beam offset.

An ATO optical element 708 (concave mirror 708), having a focal length f is disposed downstream of the diffractive bulk optic beamsplitter 706 at a distance substantially equal to the focal length f. The function of the ATO optical element 708 is essentially the same as that of the ATO optical element 108 of FIG. 1A, that is, to transform the beam angles of the plurality of optical sub-beams into beam offsets of the plurality of optical sub-beams at a distance substantially equal to the focal length f downstream of the ATO optical element 708; and to transform the beam offsets of the plurality of optical sub-beams into beam angles of the plurality of optical sub-beams at the distance substantially equal to the focal length f downstream of the ATO optical element 708. The diffractive bulk optic beamsplitter 706 is configured to dispose the plurality of optical sub-beams in a multi-row pattern 710 of optical sub-beams at the ATO optical element 708.

An array of tiltable MEMS mirrors 712 is optically coupled to the ATO optical element and disposed at a distance substantially equal to the focal length f downstream of the ATO optical element 708, for reflecting the plurality of optical sub-beams exiting the ATO optical element 708 at adjustable angles. In the embodiment shown, the array 712 of tiltable MEMS mirrors and the diffractive beamsplitter 706 are disposed on an optional common carrier 777. Also in one embodiment, a controller 790 is operable to adjustably tilt the MEMS mirrors of the array of tiltable MEMS mirrors 712.

An output waveguide array 714 is optically coupled to the array of tiltable MEMS mirrors 712, for receiving a plurality of output optical beams 744 redirected by the array of tiltable MEMS mirrors 712. Each particular one of the tiltable MEMS mirrors of the array 712 is disposed for coupling a selectable one of the plurality of optical sub-beams exiting the ATO optical element 708 into a pre-defined waveguide of the output waveguide array 714, the waveguide corresponding to the particular MEMS mirror. For ganged dul configurations of the multicast optical switch 700, there may be more than one waveguide associated with every single MEMS mirror of the tiltable MEMS mirrors array 712. The output waveguide array 714 includes a multi-row array of output waveguides, corresponding to, or appropriate for the multi-row pattern 710 of the optical sub-beams at the ATO optical element 708.

In the embodiment shown, the multicast optical switch 700 includes optional input and output telescopes 716 and 718, respectively. The input telescope 716 includes a lens 716A and a mirror 716B, and the output telescope 718 includes a lens 718A and a mirror 718B. Optional folding mirrors 120 are used to fold the beam path, resulting in a more compact device. The input telescope 716 optically couples the input microlens array 703 and the diffractive bulk optic beamsplitter 706, and matches a beam size of the optical beams at the input microlens array 703 to a beam size of the optical beams at the diffractive bulk optic beamsplitter 706. The output telescope 718 optically couples the array of tiltable MEMS mirrors 712 and the output microlens array 713, as well as provides a conversion between a pitch of MEMS mirrors of the tiltable MEMS mirror array 712 and waveguide pitch of the output waveguide array 714. Similarly to the optical switch 100 of FIG. 1A, the input and output waveguide arrays 702 and 714 of the multicast optical switch 700 of FIG. 7A include input and output microlens arrays 703 and 713, respectively, for launching the input optical beams 704 from the input waveguide array 702 and for coupling the output optical beams 744 into the output waveguide array 714, respectively. The telescope construction may vary, as is known to one of skill in the art.

The reference is now made to FIGS. 7A to 7C and FIGS. 5A to 5C. In an embodiment corresponding to the optical switch 500 of FIG. 5A, the multicast optical switch 700 of FIG. 7A includes the input waveguide array 702 having first 801 and second 802 laterally offset parallel rows of M input optical fibers, each row for emitting M of the input optical beams 704, and the output waveguide array 714 having first to fourth 821 . . . 824 laterally offset parallel rows of N/2 output optical fibers, each row for receiving N/2 of the output optical beams 744. In this embodiment, the diffractive bulk optic beamsplitter 706 is configured for splitting each of the M optical beams 704 emitted by the first 801 and second 802 rows of the input optical fibers in a two-dimensional fan of N directions including first and second rows of N/2 directions 711A, 712A and 711B, 712B, thereby forming the multi-row pattern 710 of optical sub-beams at the ATO optical element 708. The beams tracing can be assisted by referring back to FIG. 5A showing an equivalent transmissive optical circuit, wherein the first director 106 splits the beams into the two-dimensional fan of N directions including corresponding first and second rows of N/2 directions 511A, 512A and 511B, 512B, thereby forming the corresponding multi-row pattern 110 of optical sub-beams at the ATO optical element 108.

Figure 7B:
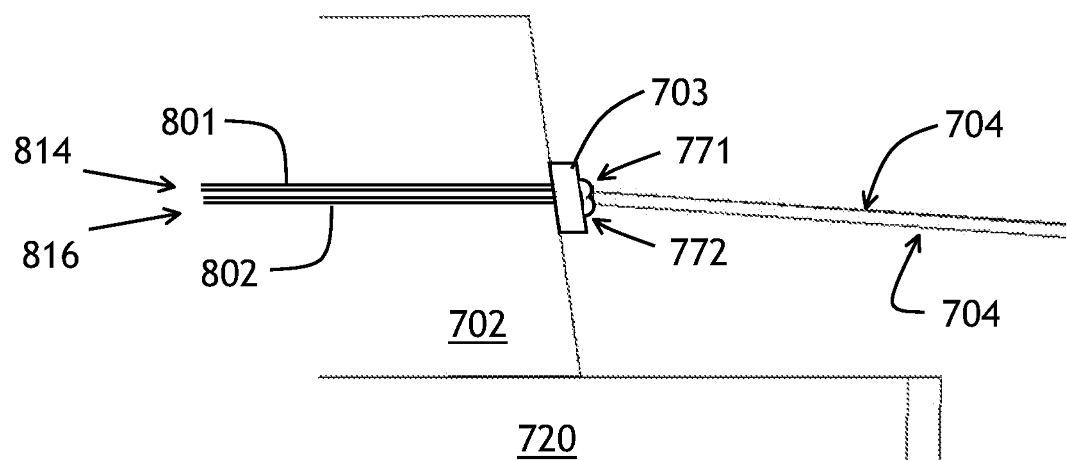
FIGS. 7B and 7C are magnified side views of input and output waveguide arrays, respectively, of the reflective dual ganged multicast optical switch of FIG. 7A.
Figure 7C:
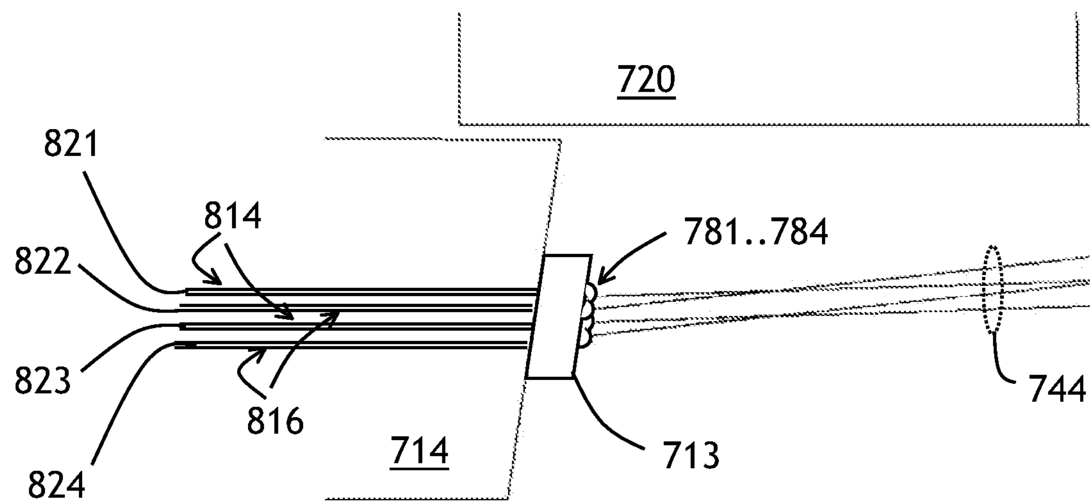

Still referring to FIGS. 7A to 7C with further reference to FIGS. 5B and 5C, the array of tiltable MEMS mirrors 712 includes first 751 and second 752 rows of N/2 tiltable MEMS mirrors, one row per row of directions of the two-dimensional fan of directions 711A, 712A and 711B, 712B. In operation, each optical beam emitted by the first row 801 of the M input optical fibers is reflected by a same tiltable MEMS mirror of the array of tiltable MEMS mirrors 712 as a corresponding optical beam emitted by the second row 802 of input optical fibers, whereby the optical beams emitted by the first 801 and second rows 802 of input optical fibers are switchable simultaneously. As a result, the multicast optical switch 700 includes first 814 and second 816 M×N multicast optical sub-switches operable in a gang fashion. The first M×N multicast optical sub-switch 814 includes the first row 801 of the M input optical fibers and the first 821 and the third 823 rows of the N/2 output optical fibers, and the second M×N multicast optical sub-switch 816 includes the second row 802 of the M input optical fibers and the second 822 and the fourth 824 rows of the N/2 output optical fibers. The propagation of the beams 704 and 744 through the input and output lens arrays 703 and 713, respectively, is best understood by referring to propagation of the corresponding beams 504 and 544 through the corresponding input and output lens arrays 103 and 113 in FIGS. 5B and 5C, respectively. In the embodiment of FIG. 7A, M=8 and N=16; the number of input and output optical fibers can of course vary. Generally, M≥4 and N≥8 results in a compact multiport device.

Still referring to FIGS. 7B and 7C, the input microlens array 703 has first 771 and second 772 laterally offset rows of M microlenses. Each microlens of the first 771 and second 772 rows of M microlenses is optically coupled to a particular input optical fiber of the first 801 and second 802 rows of M input optical fibers, respectively, for optically coupling the particular input optical fiber to the diffractive bulk optic beamsplitter 706 through the input telescope 716. The output microlens array 713 has first to fourth 781 . . . 784 laterally offset rows of N/2 microlenses. Each microlens of the first to fourth rows 781 . . . 784 of N/2 microlenses is optically coupled to a particular output optical fiber of the first to fourth rows 821 . . . 824 of N/2 output optical fibers, respectively, for optically coupling the particular output optical fiber to a predefined MEMS mirror of the array of tiltable MEMS mirrors 712 through the output telescope 718.

Figure 8A:
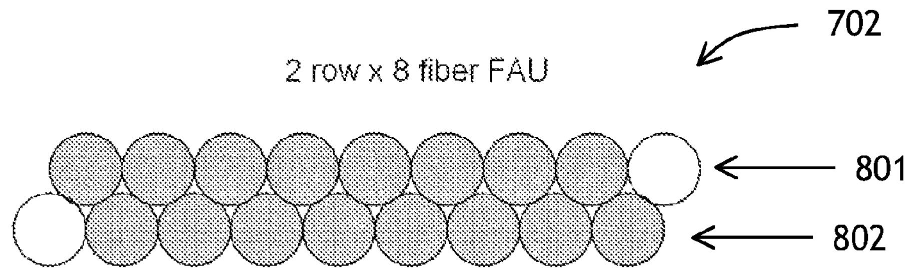
FIGS. 8A and 8B are frontal views of input and output fiber array units of the reflective dual ganged multicast optical switch of FIG. 7A.
Figure 8B:
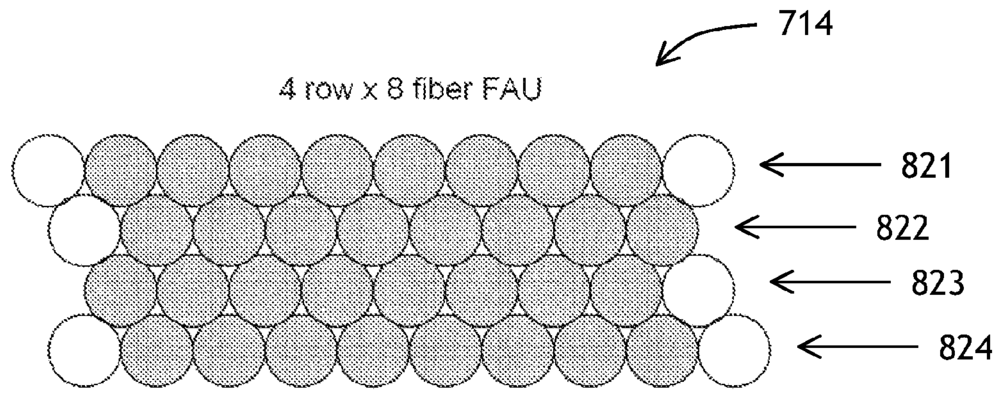
Figure 8C:
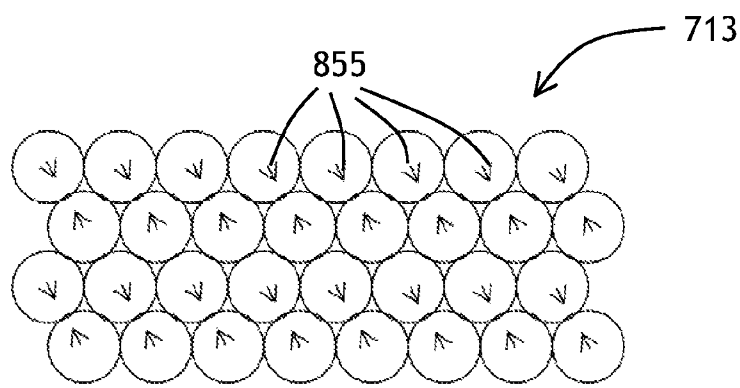
FIG. 8C is a frontal view of the output microlens array of the a reflective dual ganged multicast optical switch of FIG. 7A, showing directions of displacement of individual microlenses.

Turning now to FIGS. 8A to 8C, in a preferred embodiment, the input optical fibers of the first 801 and second 802 rows of the input waveguide array (the fiber array unit) 702, are disposed in a hexagonal pattern. The output optical fibers of the first to fourth rows 821 . . . 824 of the output waveguide array, or the fiber array unit 714, are also disposed in a hexagonal pattern. Other fiber patterns, by way of example rectangular patterns, are possible. The hexagonal, or honeycomb patterns of FIGS. 8A and 8B have a higher fill ratio. In FIG. 8C, arrows 855 denote directions of shift of optical axes of individual microlenses.

Figures 9A, 9B:
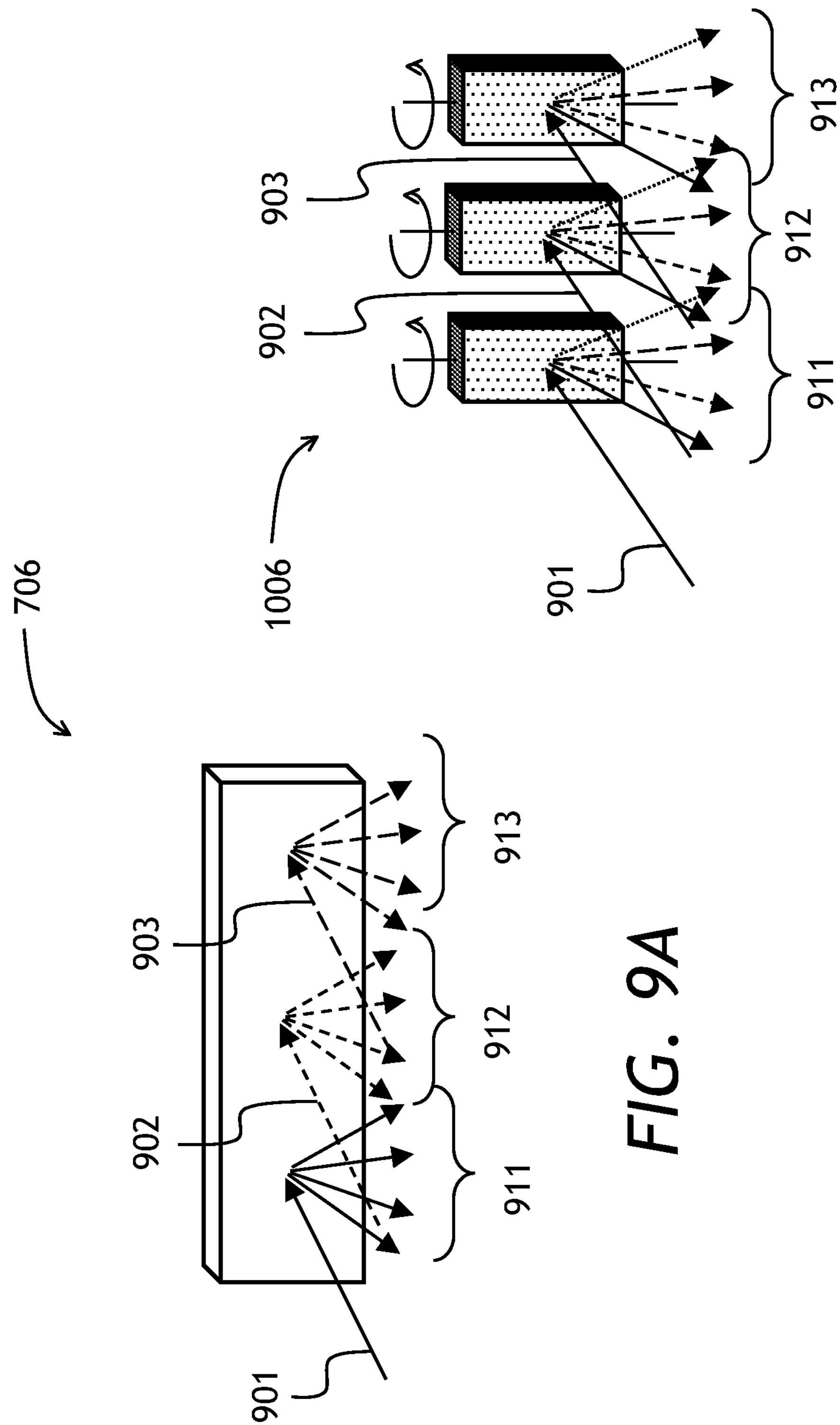
FIGS. 9A and 9B are three-dimensional views of possible implementations of the first directors in optical switches of FIGS. 1A, 2A, 3A, 5A, 6A, and 7A, including a diffractive bulk optic splitter (FIG. 9A) and a tiltable MEMS mirror array (FIG. 9B)

In the optical switches 100, 200, 300, 500, 600, and 700 of FIGS. 1A, 2A, 3A, 5A, 6A, and 7A, the diffractive beamsplitter 106 or 706 is used to split each of the plurality of optical beams 104 or 704 into an angularly spread fan of sub-beams. It is to be understood that the diffractive beamsplitters in the optical switches 100, 200, 300, 500, 600, and 700 can be replaced with MEMS mirror arrays. Referring to FIGS. 9A and 9B, the diffractive beamsplitter 706 of FIG. 9A splits each of incoming optical beams 901, 902, 903 into fans of sub-beams propagating along a fan of directions 911, 912, and 913. The MEMS mirror array 1006 of FIG. 9B redirects each of incoming optical beams 901, 902, 903 to propagate along one of directions of the fans 911, 912, and 913. Thus, one difference between the diffractive beamsplitter 706 and the MEMS mirror array 1006 is that the MEMS mirror array 1006 sends the optical beams 901, 902, 903 along one direction at a time, whereas the diffractive beamsplitter 706 splits the optical beams 901, 902, 903 into sub-beams propagating along all directions simultaneously. The second director/MEMS mirror array 112/712 performs the selection of only one optical beam to couple into a corresponding output waveguide or optical fiber, eliminating crosstalk from other beams split into the fans 911, 912, and 913. Optical paths of the beams reflected at all angles of tilt of the MEMS mirror array 1006 repeat the optical paths of the beams split into the fans 911, 912, and 913. Due to this, the present invention can work equally well with either the diffractive beamsplitter 706 or the MEMS mirror array 1006. Multicast optical switches use the diffractive beamsplitter 706, and regular optical switches use the MEMS mirror array 1006 in place of the first director 106.

Figure 10A:
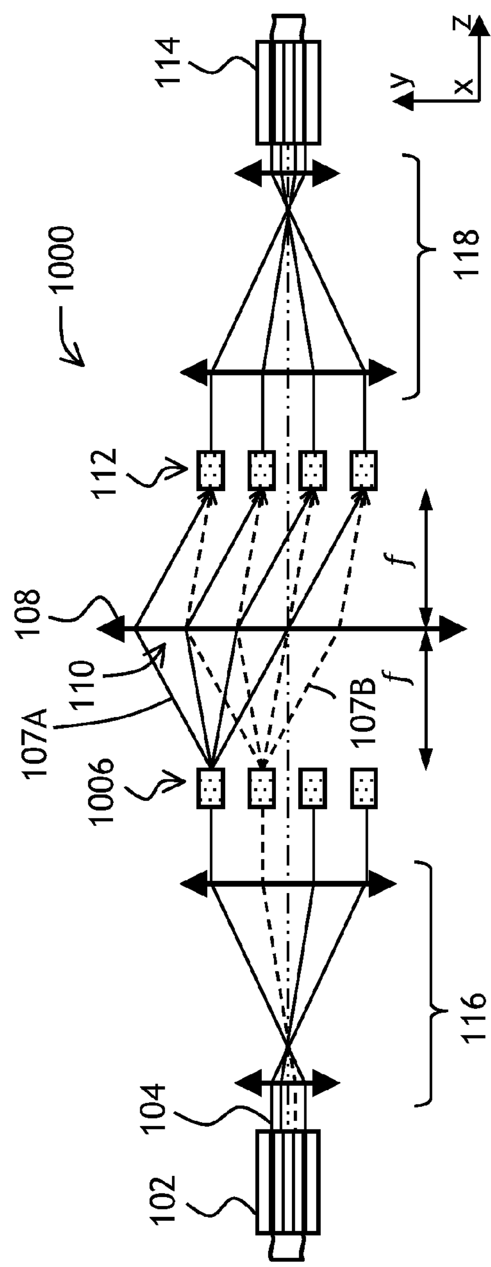
FIG. 10A is a plan view of an optical switch of FIGS. 1A and 3A having the tiltable MEMS mirror array of FIG. 9B.
Figure 10B:
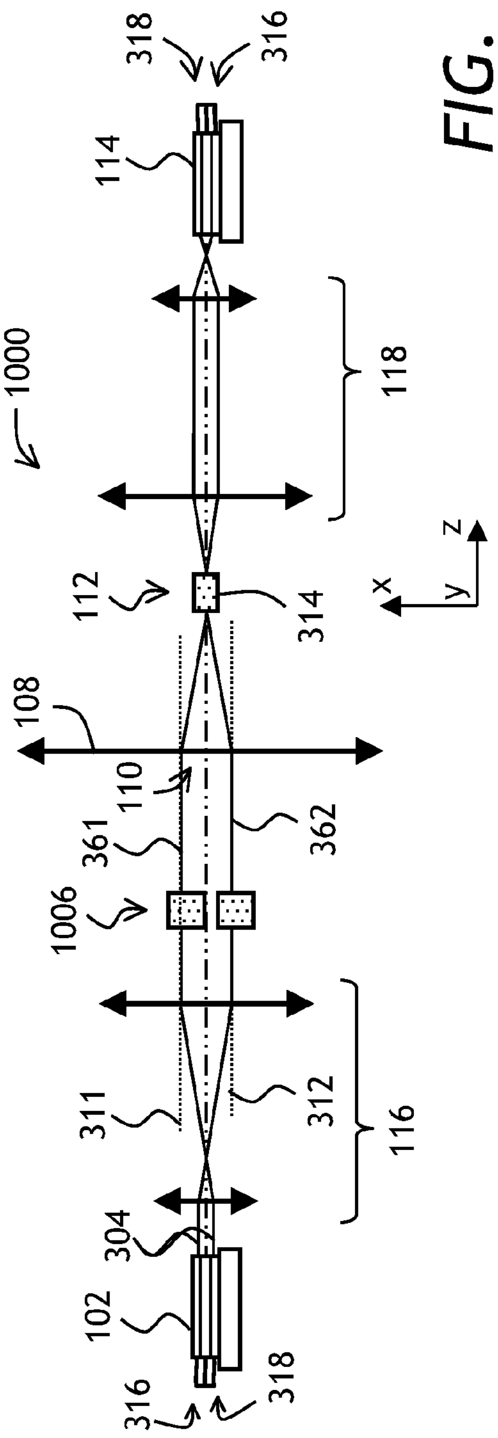
FIG. 10B is a side elevational view of the optical switch of FIG. 10A.

The latter point is further illustrated in FIGS. 10A and 10B, where an optical switch 1000 is shown in plan and side elevational views, respectively. The optical switch 1000 is a variant of the optical switches 100 and 300 of FIGS. 1A and 3A, with the first director 106 replaced by the multi-row version of MEMS mirror array 1006. It is to be understood that all the other switches described, that is, the optical switches 200, 500, 600, and 700 of FIGS. 2A, 5A, 6A, and 7A, respectively, can use a MEMS mirror array in place of the first director 106 or 706, in a similar way as the optical switch 1000 illustrated in FIGS. 10A and 10B.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optical switch comprising:

an input waveguide array for inputting a plurality of optical beams;

a first director optically coupled to the input waveguide array, for redirecting or splitting each of the plurality of optical beams, wherein each optical beam of the plurality of optical beams, redirected or split by the first director, is characterized by a beam angle and a beam offset;

an ATO optical element having a focal length, disposed downstream of the first director at a distance substantially equal to the focal length, for transforming the beam angles of the plurality of optical beams redirected or split by the first director into beam offsets of the plurality of optical beams at a distance substantially equal to the focal length downstream of the ATO optical element, and transforming the beam offsets of the plurality of optical beams redirected or split by the first director into beam angles of the plurality of optical beams at the distance substantially equal to the focal length downstream of the ATO optical element;

wherein the first director is configured to dispose the plurality of optical beams, redirected or split thereby, in a multi-row pattern of optical beams at the ATO optical element;

a second director optically coupled to the ATO optical element and disposed at a distance substantially equal to the focal length downstream of the ATO optical element, for redirecting the plurality of optical beams exiting the ATO optical element; and an output waveguide array coupled to the second director, for receiving the plurality of optical beams redirected by the second director, wherein the output waveguide array comprises a multi-row array of output waveguides, corresponding to the multi-row pattern of the optical beams at the ATO optical element; and wherein the second director comprises an array of tiltable MEMS mirrors for reflecting the plurality of optical beams at adjustable angles, wherein each particular one of the array of tiltable MEMS mirrors is disposed for coupling a selectable one of the plurality of optical beams exiting the ATO optical element to a pre-defined waveguide of the output waveguide array, corresponding to the particular MEMS mirror;

wherein the input waveguide array comprises first and second laterally offset parallel rows of M input optical fibers, each row for emitting M optical beams, and wherein the output waveguide array comprises first and second laterally offset parallel rows of N output optical fibers, each row for receiving N optical beams, wherein M and N are integer numbers>1;

wherein the first director is configured for redirecting or splitting each of the M optical beams emitted by the first and second rows of the input optical fibers in a fan of N directions disposed in first and second parallel planes, respectively, wherein the first and second planes are laterally offset from each other, thereby forming the pattern of optical beams at the ATO optical element comprising first and second rows of optical beams; and wherein the array of tiltable MEMS mirrors comprises a row of N tiltable MEMS mirrors for reflecting the first and second rows of optical beams at adjustable angles;

wherein in operation, each optical beam of the first row of optical beams is reflected by a same tiltable MEMS mirror of the row of N tiltable MEMS mirrors as a corresponding optical beam of the second row of optical beams, whereby the corresponding optical beams of the first and second rows are switchable simultaneously;

whereby the optical switch includes first and second M×N optical sub-switches operable in a gang fashion, wherein the first M×N optical sub-switch includes the first rows of the M input and N output optical fibers, and the second optical sub-switch includes the second rows of the M input and N output optical fibers.

2. An optical switch comprising:

an input waveguide array for inputting a plurality of optical beams;

a first director optically coupled to the input waveguide array, for redirecting or splitting each of the plurality of optical beams, wherein each optical beam of the plurality of optical beams, redirected or split by the first director, is characterized by a beam angle and a beam offset;

an ATO optical element having a focal length, disposed downstream of the first director at a distance substantially equal to the focal length, for transforming the beam angles of the plurality of optical beams redirected or split by the first director into beam offsets of the plurality of optical beams at a distance substantially equal to the focal length downstream of the ATO optical element, and transforming the beam offsets of the plurality of optical beams redirected or split by the first director into beam angles of the plurality of optical beams at the distance substantially equal to the focal length downstream of the ATO optical element;

wherein the first director is configured to dispose the plurality of optical beams, redirected or split thereby, in a multi-row pattern of optical beams at the ATO optical element;

a second director optically coupled to the ATO optical element and disposed at a distance substantially equal to the focal length downstream of the ATO optical element, for redirecting the plurality of optical beams exiting the ATO optical element; and an output waveguide array coupled to the second director, for receiving the plurality of optical beams redirected by the second director, wherein the output waveguide array comprises a multi-row array of output waveguides, corresponding to the multi-row pattern of the optical beams at the ATO optical element;

wherein the second director comprises an array of tiltable MEMS mirrors for reflecting the plurality of optical beams at adjustable angles, wherein each particular one of the array of tiltable MEMS mirrors is disposed for coupling a selectable one of the plurality of optical beams exiting the ATO optical element to a pre-defined waveguide of the output waveguide array, corresponding to the particular MEMS mirror;

wherein the input waveguide array comprises first and second laterally offset parallel rows of M input optical fibers, each row for emitting M optical beams, and the output waveguide array comprises first to fourth laterally offset parallel rows of N/2 output optical fibers, each row for receiving N/2 optical beams, wherein M and N are integer numbers>1;

wherein the first director is configured for redirecting or splitting each of the M optical beams emitted by the first and second rows of the input optical fibers in a two-dimensional fan of N directions including first and second rows of N/2 directions, thereby forming the multi-row pattern of optical beams at the ATO optical element; and wherein the array of tiltable MEMS mirrors comprises first and second rows of N/2 tiltable MEMS mirrors, one row per row of directions of the two-dimensional fan of directions;

wherein in operation, each optical beam emitted by the first row of the M input optical fibers is reflected by a same tiltable MEMS mirror of the array of tiltable MEMS mirrors as a corresponding optical beam emitted by the second row of input optical fibers, whereby the optical beams emitted by the first and second rows of input optical fibers are switchable simultaneously;

whereby the optical switch includes first and second M×N optical sub-switches operable in a gang fashion, wherein the first M×N optical sub-switch includes the first row of the M input optical fibers and the first and the third rows of the N/2 output optical fibers, and the second M×N optical sub-switch includes the second row of the M input optical fibers and the second and the fourth rows of the N/2 output optical fibers.

3. An optical switch comprising:

an input waveguide array for inputting a plurality of optical beams;

a first director optically coupled to the input waveguide array, for redirecting or splitting each of the plurality of optical beams, wherein each optical beam of the plurality of optical beams, redirected or split by the first director, is characterized by a beam angle and a beam offset;

an ATO optical element having a focal length, disposed downstream of the first director at a distance substantially equal to the focal length, for transforming the beam angles of the plurality of optical beams redirected or split by the first director into beam offsets of the plurality of optical beams at a distance substantially equal to the focal length downstream of the ATO optical element, and transforming the beam offsets of the plurality of optical beams redirected or split by the first director into beam angles of the plurality of optical beams at the distance substantially equal to the focal length downstream of the ATO optical element;

wherein the first director is configured to dispose the plurality of optical beams, redirected or split thereby, in a multi-row pattern of optical beams at the ATO optical element;

a second director optically coupled to the ATO optical element and disposed at a distance substantially equal to the focal length downstream of the ATO optical element, for redirecting the plurality of optical beams exiting the ATO optical element; and an output waveguide array coupled to the second director, for receiving the plurality of optical beams redirected by the second director, wherein the output waveguide array comprises a multi-row array of output waveguides, corresponding to the multi-row pattern of the optical beams at the ATO optical element;

wherein the second director comprises an array of tiltable MEMS mirrors for reflecting the plurality of optical beams at adjustable angles, wherein each particular one of the array of tiltable MEMS mirrors is disposed for coupling a selectable one of the plurality of optical beams exiting the ATO optical element to a pre-defined waveguide of the output waveguide array, corresponding to the particular MEMS mirror;

wherein the input waveguide array comprises first and second laterally offset parallel rows of M input optical fibers, each row for emitting M optical beams, and wherein the output waveguide array comprises first and second laterally offset parallel rows of N output optical fibers, each row for receiving N optical beams, wherein M and N are integer numbers>1;

wherein the first director is configured for redirecting or splitting each of the M optical beams emitted by the first and second rows of the input optical fibers in a fan of N directions disposed in first and second planes, respectively, thereby forming the multi-row pattern at the ATO optical element, the multi-row pattern comprising first and second rows of optical beams, respectively; and wherein the array of tiltable MEMS mirrors comprises first and second rows of N tiltable MEMS mirrors, for reflecting the first and second rows of optical beams, respectively, at adjustable angles;

wherein in operation, each optical beam of the first row of optical beams is reflected by a particular tiltable MEMS mirror of the first row of the N tiltable MEMS mirrors, and each optical beam of the second row of optical beams is reflected by a particular tiltable MEMS mirror of the second row of the N tiltable MEMS mirrors, whereby the optical beams of the first and second rows are switchable independently, whereby the optical switch includes independently operable first and second M×N optical sub-switches, wherein the first M×N optical sub-switch includes the first rows of the M input and N output optical fibers and the first row of the N tiltable MEMS mirrors, and wherein the second M×N optical sub-switch includes the second rows of the M input and N output optical fibers and the second row of the N tiltable MEMS mirrors.

4. The optical switch of claim 1, further comprising an output telescope disposed in an optical path between the array of tiltable MEMS mirrors and the output waveguide array, for providing optical coupling therebetween, and for matching a waveguide pitch of the output waveguide array to a mirror pitch of the array of tiltable MEMS mirrors.

5. The optical switch of claim 4, further comprising an input telescope disposed in an optical path between the input waveguide array and the first director, for providing optical coupling therebetween, and for matching a beam size of the optical beams emitted by the input waveguide array to a beam size of the optical beams at the first director.

6. A multicast optical switch comprising:

an input waveguide array for inputting a plurality of optical beams;

a diffractive bulk optic beamsplitter optically coupled to the input waveguide array, for splitting each of the plurality of optical beams into a plurality of sub-beams, wherein each optical sub-beam of the plurality of optical sub-beams split by the diffractive bulk optic beamsplitter is characterized by a beam angle and a beam offset;

an ATO optical element having a focal length, disposed downstream of the diffractive bulk optic beamsplitter at a distance substantially equal to the focal length, for transforming the beam angles of the plurality of optical sub-beams into beam offsets of the plurality of optical sub-beams at a distance substantially equal to the focal length downstream of the ATO optical element, and for transforming the beam offsets of the plurality of optical sub-beams beamsplitter into beam angles of the plurality of optical sub-beams at the distance substantially equal to the focal length downstream of the ATO optical element;

wherein the diffractive bulk optic beamsplitter is configured to dispose the plurality of optical sub-beams into a multi-row pattern of optical sub-beams at the ATO optical element;

an array of tiltable MEMS mirrors optically coupled to the ATO optical element and disposed at a distance substantially equal to the focal length downstream of the ATO optical element, for reflecting the plurality of optical sub-beams exiting the ATO optical element at adjustable angles; and an output waveguide array optically coupled to the array of tiltable MEMS mirrors, for receiving the plurality of optical sub-beams redirected by the array of tiltable MEMS mirrors;

wherein each particular one of the tiltable MEMS mirrors is disposed for coupling a selectable one of the plurality of optical sub-beams exiting the ATO optical element to a pre-defined waveguide of the output waveguide array, corresponding to the particular MEMS mirror; and wherein the output waveguide array comprises a multi-row array of output waveguides, corresponding to the multi-row pattern of the optical sub-beams at the ATO optical element;

wherein the input waveguide array comprises first and second laterally offset parallel rows of M input optical fibers, each row for emitting M optical beams, and the output waveguide array comprises first to fourth laterally offset parallel rows of N/2 output optical fibers, each row for receiving N/2 optical beams, wherein M and N are integer numbers>1;

wherein the diffractive bulk optic beamsplitter is configured for splitting each of the M optical beams emitted by the first and second rows of the input optical fibers in a two-dimensional fan of N directions including first and second rows of N/2 directions, thereby forming the multi-row pattern of optical sub-beams at the ATO optical element;

wherein the array of tiltable MEMS mirrors comprises first and second rows of N/2 tiltable MEMS mirrors, one row per row of directions of the two-dimensional fan of directions;

wherein in operation, each optical beam emitted by the first row of the M input optical fibers is reflected by a same tiltable MEMS mirror of the array of tiltable MEMS mirrors as a corresponding optical beam emitted by the second row of input optical fibers, whereby the optical beams emitted by the first and second rows of input optical fibers are switchable simultaneously;

whereby the multicast optical switch includes first and second M×N multicast optical sub-switches operable in a gang fashion, wherein the first M×N multicast optical sub-switch includes the first row of the M input optical fibers and the first and the third rows of the N/2 output optical fibers, and the second M×N multicast optical sub-switch includes the second row of the M input optical fibers and the second and the fourth rows of the N/2 output optical fibers.

7. The multicast optical switch of claim 6, further comprising:

an input microlens array having first and second laterally offset rows of M microlenses, wherein each microlens of the first and second rows of M microlenses is coupled to a particular input optical fiber of the first and second rows of M input optical fibers, respectively, for optically coupling the particular input optical fiber to the diffractive bulk optic beamsplitter; and an output microlens array having first to fourth laterally offset rows of N/2 microlenses, wherein each microlens of the first to fourth rows of N/2 microlenses is coupled to a particular output optical fiber of the first to fourth rows of N/2 output optical fibers, respectively, for optically coupling the particular output optical fiber to a pre-defined MEMS mirror of the array of tiltable MEMS mirrors.

8. The multicast optical switch of claim 7, wherein each microlens of the output microlens array has an optical axis that is laterally offset from a corresponding output optical fiber of the output fiber array, for coupling optical sub-beams disposed at an angle with respect to the optical axis.

9. The multicast optical switch of claim 8, further comprising an output telescope disposed in an optical path between the array of tiltable MEMS mirrors and the output microlens array, for providing optical coupling therebetween, and for matching a fiber pitch of the output fiber array to a mirror pitch of the array of tiltable MEMS mirrors.

10. The multicast optical switch of claim 9, further comprising an input telescope disposed in an optical path between the input microlens array and the diffractive bulk optic beamsplitter, for providing optical coupling therebetween, and for matching a beam size of the optical beams at the input microlens array to a beam size of the optical beams at the diffractive bulk optic beamsplitter.

11. The multicast optical switch of claim 10, wherein the input and output telescopes each comprise a concave mirror.

12. The multicast optical switch of claim 6, wherein the ATO optical element comprises a concave mirror.

13. The multicast optical switch of claim 12, wherein the diffractive bulk optic beamsplitter is a reflective beamsplitter.

14. The multicast optical switch of claim 13, wherein the array of tiltable MEMS mirrors and the reflective beamsplitter are disposed on a common carrier.

15. The multicast optical switch of claim 6, wherein the input optical fibers of the first and second rows are disposed in a hexagonal pattern, and wherein the output optical fibers of the first to fourth rows are disposed in a hexagonal pattern.

16. The multicast optical switch of claim 6, wherein $M \geq 4$ and $N \geq 8$.

17. The multicast optical switch of claim 6, further comprising a controller for adjustably tilting the MEMS mirrors of the array of tiltable MEMS mirrors.

18. The optical switch of claim 2, further comprising an output telescope disposed in an optical path between the array of tiltable MEMS mirrors and the output waveguide array, for providing optical coupling therebetween, and for matching a waveguide pitch of the output waveguide array to a mirror pitch of the array of tiltable MEMS mirrors.

19. The optical switch of claim 18, further comprising an input telescope disposed in an optical path between the input waveguide array and the first director, for providing optical coupling therebetween, and for matching a beam size of the optical beams emitted by the input waveguide array to a beam size of the optical beams at the first director.

20. The optical switch of claim 3, further comprising an output telescope disposed in an optical path between the array of tiltable MEMS mirrors and the output waveguide array, for providing optical coupling therebetween, and for matching a waveguide pitch of the output waveguide array to a mirror pitch of the array of tiltable MEMS mirrors.

21. The optical switch of claim 20, further comprising an input telescope disposed in an optical path between the input waveguide array and the first director, for providing optical coupling therebetween, and for matching a beam size of the optical beams emitted by the input waveguide array to a beam size of the optical beams at the first director.

* * * * *